United States Patent Office 3,597,343

Patented Aug. 3, 1971

3,597,343

PHOTOPOLYMERIZATION OF ETHYLENICALLY UNSATURATED COMPOUNDS THROUGH THE USE OF NOVEL AZOLE PHOTOINITIATORS

Gerard Albert Delzenne, 's-Gravenwezel, and Urbain Leopold Laridon, Wilrijk, Belgium, assignor to Gevaert-Agfa N.V., Mortsel, Belgium No Drawing. Filed Nov. 21, 1967, Ser. No. 684,611
Claims priority, application Great Britain, Dec. 8, 1966, 55,095/66
Int. Cl. C08d *1/00;* C08f *1/16*
U.S. Cl. 204—159.23 9 Claims

ABSTRACT OF THE DISCLOSURE

A process for photopolymerization of ethylenically unsaturated organic compounds is described which comprises irradiating a composition including a photopolymerizable ethylenically unsaturated organic compound and as a photopolymerization initiator an azole compound having the formula:

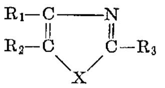

wherein:

X is oxygen, sulphur, —NH— or a —NR— group, wherein R is an alkyl group of 1 to 4 carbon atoms, or benzyl, each of $R_1$ and $R_2$ (same or different) is hydrogen, halogen, an alkyl group of 1 to 4 carbon atoms, or a phenyl group, and $R_3$ is hydrogen, halogen, an alkyl group of 1 to 4 carbon atoms, a phenyl group, a naphthyl group or a styryl group;

or an azole compound which comprises an imidazole group incorporated in a polymer comprising recurring units of the formula:

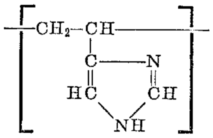

The present invention relates to the photopolymerisation of ethylenically unsaturated organic compounds and to polymers obtained therefrom.

The photopolymerisation of ethylenically unsaturated organic compounds can be initiated by exposure to high intensity radiation such as ultra-violet rays. Methyl acrylate, for instance, on long standing in sun light is transformed into a transparent mass (cf. Ellis: The Chemistry of Synthetic Resins, vol. II (1935) page 1072). Polymerisation, however, by the use of light alone, proceeds at a very much slower rate when compared to polymerisation brought about by a free radical generating catalyst or by heat. Moreover, the use of light alone, unaided by other agents, requires very long exposure times in order to polymerise the monomer sufficiently. Furthermore, the low rate of polymerisation necessitates the use of extremly intense radiations such as those obtained from high intensity mercury vapour lamps or carbon arcs.

A lot of photopolymerisation initiators, which under the influence of actinic light increase the photopolymerisation rate, have already been described. A survey of such photopolymerisation initiators has been given by G. Delzenne in Industrie Chimique Belge, 24 (1959) 739–764.

An object of the present invention is to provide a new class of photopolymerisation intiators which can be activated by actinic light.

Another object of the present invention is to provide a new class of photopolymerisation initiators which require a short exposure to actinic light.

A further object is to provide a process whereby the photopolymerisation of ethylenically unsaturated organic compounds can be carried out at a practicable rate by visible light as well as by ultra-violet light.

Other objects will appear hereinafter.

According to the present invention a process is provided for the photopolymerisation of ethylenically unsaturated organic compounds, which process comprises irradiating with light of wavelengths ranging from 2500 to 7000 angstroms a composition comprising a photopolymerisable ethylenically unsaturated organic compound and as a photopolymerisation initiator an azole compound of the formula:

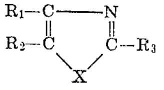

wherein:

X represents an oxygen atom, a sulphur atom, the group —NH or the group —NR wherein R represents an alkyl group of 1 to 4 carbon atoms or a benzyl group;

each of $R_1$ and $R_2$ (same or different) represents a hydrogen atom, a halogen atom, an alkyl group of 1 to 4 carbon atoms, a phenyl group including a substituted phenyl group; and $R_3$ represents a hydrogen atom, a halogen atom, an alkyl group of 1 to 4 carbon atoms, a phenyl group including a substituted phenyl group, a naphthyl group, or a styryl group;

or wherein the azole compound is an imidazole group incorporated in a polymer comprising recurring units of the formula:

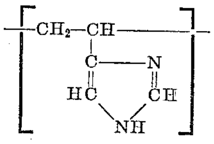

The quantity of azoles (oxazoles, imidazoles or thiazoles) or of polymeric imidazole to be used as photopolymerisation initiator will of course be dependent upon many variables including the particular initiator used, the wavelength of light employed, the irradiation time and the monomer or monomers present. Usually the amount of azole or of polymeric imidazole is within the range of 0.01 to 5% by weight based on the monomeric material initially present. It is seldom necessary to employ more than 0.2 to 2% by weight to obtain a good polymerisation rate.

In the further description there will be understood under the term "azoles" not only oxazoles, imidazoles and thiazoles but also the polymeric imidazoles.

The ethylenically unsaturated organic compounds may be exposed to any source of radiation providing wavelengths in the range of 2500–7000 angstroms, preferably 2500–6000 angstroms and still more preferably in the wavelength region of 3000–4000 angstroms. Suitable light sources include carbon arcs, mercury vapour lamps, fluorescent lamps, argon glow lamps, photographic flood lamps and tungsten lamps. Moreover, ordinary daylight may be used too.

A considerable increase of the rate of polymerisation can also be obtained by adding activating dyes taken from the class of acridine, phenazine, and fluresceine dyes, and more particularly photo-oxidation sensitizers, in a concentration of 0.001 to 0.1% by weight based on the monomeric material present.

The photopolymerisation can be carried out by any of the well-known processes, such as bulk, emulsion, suspension and solution polymerisation processes. In all of these processes, the addition of an azole according to the invention to polymerisable materials subjected to the action of actinic light greatly increases the rate of photopolymerisation.

A base or support may be coated with a solution of the ethylenically unsaturated organic compound in a solvent therefor, this solution containing in dissolved state or homogeneously dispersed therein a photopolymerisation-initiating azole compound, whereupon the solvent or solvent mixture is eliminated by known means such as evaporation, leaving a more or less thin coating of the ethylenically unsaturated organic compound on the base or support. Thereafter the dried photopolymerisable coating is exposed to actinic light rays.

When exposing the photopolymerisable composition to actinic light rays the polymerisation does not start immediately. Only after a short period, which among others depends on the ethylenically unsaturated organic composition, the photopolymerisation initiator and the light-intensity used, the photopolymerisation starts. The period necessary for obtaining a perceptible amount of polymerisation is a measure of the efficiency of the photopolymerisation initiator, and is named the inhibition period.

In some circumstances it may be desirable that the photopolymerisable composition comprises a hydrophilic or hydrophobic colloid as carrier or binding agent for the ethylenically unsaturated organic compound and the photopolymerization initiating azole compound. By the presence of this binding agent the properties of the light-sensitive layer are of course highly influenced. The choice of the binding agent is dependent on its solubility in solvents, which can also be used as solvents for the ethylenically unsaturated organic compounds and for the azole compound of the invention. Such binding agents are for instance poly(styrene), poly(methyl methacrylate), poly(vinyl acetate), poly(vinylbutyral), partially saponified cellulose acetate and other polymers that are soluble in solvents for initiators and monomers. In some instances water-soluble polymers can be used such as gelatin, casein, starch, carboxymethyl-cellulose and poly (vinyl alcohol). It is evident that the ratio of photopolymerisable composition to binding agent also influences the photopolymerisation. The larger this ratio, the higher the photopolymerisation rate generally will be for one and the same ethylenically unsaturated organic compound.

If the photopolymerisable composition is water-soluble water may be used as solvent for coating the support. On the contrary, if water-insoluble photopolymerisable compositions are used, organic solvents, mixtures of organic solvents or mixtures of organic solvents and water may be used.

Examples of suitable azole compounds are:

2,5-diphenyl-oxazole
2,5-diphenyl-4-methyl-oxazole
2,4,5-triphenyl-oxazole
2-styryl-5-phenyl-oxazole
2-(1-naphthyl)-5-phenyl oxazole imidazole
4,5-diphenyl-imidazole
2,4,5-triphenyl-imidazole (Iophine)
2-methyl-4,5-diphenyl-imidazole
2,4,5-trimethyl-imidazole
2,4,5-tribromoimidazole
4,5-bis(p-methoxyphenyl)-imidazole
2,4,5-triphenyl-N-methyl-imidazole
N-benzyl-imidazole
2,4,5-triphenyl-thiazole.

The polymeric imidazoles, which are suitable as polymerisation initiators according to the invention, are polymers comprising a substantial amount of recurring units deriving from 4-vinyl-imidazole such as a copolymer of methyl methacrylate and 4-vinyl-imidazole.

Among these azoles the oxazoles can be obtained either by dehydration of the corresponding acylamino derivatives with phosphorus pentachloride or with sulfuric acid, or by reduction of the corresponding oxido-oxazoles synthesized by condensation of 1,2-diketomonoxime with aldehydes. Both methods are summarized in Chemical Reviews 37, 401 (1945).

A general synthesis for imidazole derivatives is the condensation of 1,2-dicarbonyl compounds with ammonia and an aldehyde. N-methyl imidazoles were obtained from the corresponding quaternized oxazoles by treating them with ammonium acetate and acetic acid under refluxing, whereas N-benzyl imidazole was obtained by reacting imidazole with benzylchloride.

The thiazoles are readily obtained either by condensation of thioamides with α-halogenated aldehydes or ketones, or by treating aminoaldehydes, aminoketones or aminoacid esters with phosphorus pentasulfide.

The process of the invention is applied to the photopolymerisation of compositions comprising ethylenically unsaturated organic compounds. These compositions may comprise one or more ethylenically unsaturated polymerisable compounds such as styrene, acrylamide, methacrylamide, methyl methacrylate and acrylonitrile. When two of these monomers are used in the same photopolymerisable composition or if they are mixed with other polymerisable compounds, copolymers are formed during the photopolymerisation. It is further presumed that in the case where the photopolymerisable material is used together with a polymeric binding agent, graft copolymers are formed between the polymeric binder and the photopolymerised material.

The photopolymerisable composition may also comprise or consist of unsaturated compounds having more than one carbon-to-carbon double bond, e.g. two terminal vinyl groups, or of a polymeric compound having ethlylenic unsaturation. During polymerisation of these compositions usually cross-linking will occur by means of the plurally unsaturated compound. Examples of compounds containing more than one carbon-to-carbon double bond, are, e.g., divinylbenzene, diglycol diacrylates and N,N'-alkylene-bis-acrylamides. Examples of polymeric compounds containing ethylenically unsaturation are, e.g. allyl esters of polyacrylic acid, maleic esters of polyvinyl alcohol, polyhydrocarbons still containing carbon-to-carbon double bonds, unsaturated polyesters, cellulose acetomaleates, and allyl cellulose.

In the photopolymerization of ethylenically unsaturated compounds with azoles of the invention high temperatures are not needed. The exposure, however, to strong light sources at a relatively short distance, brings about a certain heating of the mass to be polymerised, which heating exercises a favourable influence upon the polymerisation rate.

The products of the invention are useful as adhesives, coating and impregnating agents, safety glass interlayers, etc. When photopolymerisation of the compositions is carried out within a mold, optical articles such as lenses can be obtained.

The photopolymerisable compositions which contain azoles according to the invention are useful in the preparation of photographic images. In this respect the present invention also comprises spreading the polymerisable composition upon a surface such as a surface of metal and printing a design thereon photographically by exposure to light through a suitable image pattern. Hereby the light induces polymerisation in the exposed areas of the photopolymerisation composition whereby the polymeric layer is rendered insoluble in the solvent or solvents used for applying the photopolymerisable layer. Thereafter the non-exposed areas are washed away with a solvent for the monomeric material. In this way printing plates and photographic resist images are manufactured, which can be further used as planographic printing plates, as matrices for printing matter, as screens for silk screen printing, and as photoresists for etching.

The image-wise photopolymerisation can also induce differential softening properties to the layer. This makes possible a reproduction process by material transfer when the image-wise photopolymerised layer is subsequently warmed up and pressed against a receiving sheet, so that the softened areas are transferred to the receiving sheet.

The following examples illustrate the present invention.

EXAMPLE 1

A series of amounts of 3 g. of acrylamide was dissolved in as many quantities of a mixture of 5 ccs. of water and 5 ccs. of methylglycol, to which initiating agents had been added in a $10^{-3}$ mole/litre concentration. Then the solutions obtained were poured into chemically and heat-resistant glass tubes. To some of these glass tubes an amount of photo-oxidation sensitizer corresponding with $10^{-4}$ mole/litre as indicated in Table I below is added. Exposure occurred with an air-cooled 300 watt high pressure mercury vapour lamp placed at a distance of 18 cm. After exposure each solution was poured into methanol whereby the polymer formed precipitated. Then each polymer was separated, vacuum-dried and weighed. The point at which the polymer could not be separated anymore—in the table named gelification point—corresponds with a polymer yield of 90 to 95%. The results of the exposure tests are shown in Table I.

TABLE I

| Test | Initiator | Photo-oxidation sensitizer | Exposure time in min. | Yield of polymer in percent |
|---|---|---|---|---|
| 1 | 2,4,5-triphenyloxazole | | 15 | 2.5 |
| | | | 30 | 10.5 |
| | | | 45 | 23.8 |
| | | | 60 | 33.2 |
| | | | 75 | 48 |
| 2 | do | Rose bengale | 15 | 7 |
| | | | 30 | 30 |
| | | | 45 | 59.3 |
| | | | 60 | (1) |
| 3 | do | Euflavine | 15 | 8.7 |
| | | | 30 | 36.5 |
| | | | 45 | (1) |
| 4 | 2-(1-naphthyl)-5-phenyloxazole | | 15 | 5 |
| | | | 30 | 19.5 |
| | | | 45 | 37.5 |
| | | | 60 | 43.5 |
| | | | 75 | 64 |
| 5 | do | Rose bengale | 15 | 6.7 |
| | | | 30 | 20 |
| | | | 45 | 40 |
| | | | 60 | (1) |
| 6 | 2,5-diphenyl-4-methyloxazole | | 45 | 2.2 |
| | | | 60 | 7.3 |
| | | | 75 | 9.9 |
| 7 | do | Rose bengale | 15 | 3.7 |
| | | | 30 | 10.7 |
| | | | 45 | 17.4 |
| | | | 60 | 24 |
| | | | 75 | 30 |
| 8 | 2,5-diphenyloxazole | do | 15 | 4.3 |
| | | | 30 | 18.1 |
| | | | 45 | 45.4 |
| | | | 60 | (1) |
| 9 | 2-styryl-5-phenyloxazole | do | 15 | 4.1 |
| | | | 30 | 10 |
| | | | 45 | 18.1 |
| | | | 60 | 27.7 |
| | | | 75 | 33.3 |
| 10 | 2-o-chlorophenyl-5-phenyloxazole | do | 60 | 62 |
| 11 | 2-p-methoxyphenyl-5-phenyloxazole | do | 60 | 57 |
| 12 | 2-p-nitrophenyl-5-phenyloxazole | do | 60 | 30 |
| 13 | 2-m-nitrophenyl-5-phenyloxazole | do | 60 | 28 |
| 14 | 2,4,5-triphenylimidazole (Iophine) | | 60 | 2 |
| | | | 120 | 13.1 |
| | | | 240 | 56.3 |
| | | | 300 | 87.5 |
| 15 | 2,4,5-triphenylimidazole | Rose bengale | 5 | 8.15 |
| | | | 10 | 36 |
| | | | 15 | (1) |
| 16 | do | Erythrosine | 5 | 2.45 |
| | | | 10 | 13.8 |
| | | | 15 | 42.75 |
| | | | 20 | (1) |
| 17 | do | Eosine | 20 | (1) |
| 18 | do | Safranine T (C.I. 50.240) | 60 | 13.1 |
| | | | 120 | 58.5 |
| | | | 180 | (1) |
| 19 | do | Benzoflavine BFX (C.I. 46.065). | 45 | 34.2 |
| | | | 60 | 42 |
| | | | 75 | 60 |
| | | | 90 | (1) |

TABLE I.—Continued

| Test | Initiator | Photo-oxidation sensitizer | Exposure time in min. | Yield of polymer in percent |
|---|---|---|---|---|
| 20 | 4,5-diphenylimidazole | Rose bengale | 5 | 3.57 |
| | | | 10 | 11.7 |
| | | | 15 | 15.7 |
| | | | 30 | 35.2 |
| 21 | Imidazole | do | 10 | (1) |
| | | | 30 | 7.35 |
| | | | 45 | 24.4 |
| | | | 60 | (1) |
| 22 | N-Methyl-2,4,5-triphenylimidazole | do | 5 | 3.5 |
| | | | 10 | 13 |
| | | | 15 | 42.5 |
| | | | 20 | (1) |
| 23 | N-Benzylimidazole | do | 15 | 6.7 |
| | | | 30 | 24.2 |
| | | | 45 | (1) |
| 24 | 2,4,5-triphenylthiazole | do | 90 | 2.24 |
| | | | 180 | 57.7 |

EXAMPLE 2

In a chemically and heat-resistant glass tube a solution is placed of 6 g. of acrylamide in a mixture of 10 ccs. of water and 10 ccs. of methylglycol, whereafter 2,4,5-triphenyloxazole and rose bengale are added in amounts of $10^{-3}$ mole and $10^{-4}$ mole respectively per litre of solution. Exposure is carried out with a 300 watt tungsten lamp placed at 20 cm. and occurs exclusively in the wavelength range beyond 4000 A. The results are listed in Table II below.

TABLE II

| Test | Exposure time in min. | Yield of polymer in percent |
|---|---|---|
| 25 | 15 | 1.1 |
| | 30 | 3.3 |
| | 45 | 4.3 |
| | 60 | 8.4 |
| | 75 | 14.1 |

EXAMPLE 3

In chemically and heat-resistant glass tubes are placed a solution of 3 g, of acrylamide in a mixture of 5 ccs. of water and 5 ccs. of methylglycol, $10^{-3}$ mole/litre of an imidazole as listed below as an initiator, and $10^{-4}$ mole/litre of rose bengale as a photo-oxidation sensitizer. Then the solutions are exposed by means of a high-pressure mercury vapour lamp of 80 watt placed at 12 cm. Thereafter the polymer formed is precipitated by adding an excess of methanol, and separated.

TABLE III

| Test | Initiator | Sensitizer | Exposure time in min. | Yield of polymer in percent |
|---|---|---|---|---|
| 26 | 4,5-diphenyl-2-methylimidazole | Rose bengale | 10 | 13.3 |
| 27 | 2,4,5-tribromoimidazole | do | 15 | 15 |
| 28 | 2,4,5-trimethylimidazole | do | 15 | 11.7 |
| 29 | 4,5-bis (p methoxyphenyl) imidazole | do | 18 | 45 |
| 30 | 2-m-nitrophenyl-4,5-diphenylimidazole | do | 15 | 40 |

EXAMPLE 4

In a chemically and heat-resistant glass tube is placed a solution of 5 ccs. triethylene glycol diacrylate in a mixture of 10 ccs. of water and 10 ccs. of glycol methyl ether. As polymerisation initiator are added $10^{-3}$ mole/litre of triphenyl-imidazole and as photo-oxidation sensitizer $10^{-4}$ mole/litre of rose bengale.

The solution is exposed by means of a high pressure mercury vapour lamp of 300 watt at a distance of 18 cm. After a 10 minute exposure the precipitated polymer formed is separated and dried. Yield of polymer: 10%.

EXAMPLE 5

10 mg. of a copolymer of methyl methacrylate and 4-vinyl-imidazole comprising 28 moles percent of 4-vinylimidazole units prepared similarly to the procedure described by Overberger and Vorchheimer (J. Am. Chem. Soc. 85, 951, 1963) are dissolved in a mixture of 5 ccs. of glycolmethylether and 5 ccs. of water, together with 3 g. of acrylamide and 1 mg. of rose bengale.

The solution obtained is exposed for 10 minutes by means of a high pressure mercury vapour lamp of 80 watt, at a distance of 12 cm. whereafter the precipitated polymer is separated and dried. Yield of polymer: 54%.

We claim:

1. Process for the photopolymerisation of ethylenically unsaturated organic compounds, which comprises irradiating with light of wavelengths ranging from 2500 to 7000 angstroms a composition comprising a photopolymerisable ethylenically unsaturated organic compound and as a photopolymerisation initiator (1) an azole compound of the general formula:

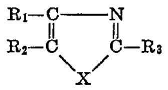

wherein:

X is oxygen, sulphur, —NH— or a —NR— group, wherein R is an alkyl group of 1 to 4 carbon atoms, or benzyl, each of $R_1$ and $R_2$ (same or different) is hydrogen, halogen, an alkyl group of 1 to 4 carbon atoms, or a phenyl group, and $R_3$ is hydrogen, halogen, an alkyl group of 1 to 4 carbon atoms, a phenyl group, a naphthyl group or a styryl group;

or (2) an azole compound which is an imidazole group incorporated in a polymer comprising recurring units of the formula:

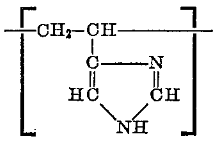

2. Process according to claim 1, wherein the photopolymerisation initiator is present in an amount within the range of 0.01 to 5% by weight based on the weight of the ethylenically unsaturated organic compound present.

3. Process according to claim 1, wherein a photo-oxidation sensitizer of the class consisting of acridine, phenazine, or fluoresceine dyes is present in the photopolymerisation composition in an amount between 0.001 and 0.1% by weight with respect to the ethylenically unsaturated organic compound present.

4. Process according to claim 3, wherein the photopolymerisation initiator is 2,4,5-triphenyloxazole and the photo-oxidation sensitizer is euflavine.

5. Process according to claim 3, wherein the photopolymerisation initiator is 2,4,5-triphenylimidazole and the photo-oxidation sensitizer is rose bengale.

6. Process according to claim 3, wherein the photopolymerisation initiator is N-methyl-2,4,5-triphenyl-imidazole and the photo-oxidation sensitizer is rose bengale.

7. Process according to claim 3, wherein the photopolymerisation initiator is a copolymer of methyl methacrylate and 4-vinylimidazole comprising 28 moles percent of 4-vinyl-imidazole and the photo-oxidation sensitizer is rose bengale.

8. Process according to claim 1, wherein the light used for irradiating the ethylenically unsaturated organic compounds has a wavelength ranging from 2500 to 6000 angstroms.

9. Process according to claim 1, wherein the light used for irradiating the ethylenically unsaturated organic compounds is common daylight.

References Cited

UNITED STATES PATENTS 3,479,185 11/1969 Chambers, Jr.

FOREIGN PATENTS 1,481,819 4/1967 France ---------- 204—159.23

MURRAY TILLMAN, Primary Examiner

R. B. TURER, Assistant Examiner

U.S. Cl. X.R.

96—115P; 204—159.24; 260—86.1R, 88.3R